United States Patent
Takama

(10) Patent No.: US 11,134,597 B2
(45) Date of Patent: Sep. 28, 2021

(54) COMPONENT MOUNTING DEVICE

(71) Applicant: YAMAHA HATSUDOKI KABUSHIKI KAISHA, Iwata (JP)

(72) Inventor: Kazushi Takama, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 649 days.

(21) Appl. No.: 15/759,476

(22) PCT Filed: Oct. 14, 2015

(86) PCT No.: PCT/JP2015/079085
§ 371 (c)(1),
(2) Date: Mar. 12, 2018

(87) PCT Pub. No.: WO2017/064777
PCT Pub. Date: Apr. 20, 2017

(65) Prior Publication Data
US 2018/0263150 A1    Sep. 13, 2018

(51) Int. Cl.
*H05K 13/04* (2006.01)
*H05K 13/08* (2006.01)

(52) U.S. Cl.
CPC ..... *H05K 13/0452* (2013.01); *H05K 13/0465* (2013.01); *H05K 13/082* (2018.08); *H05K 13/083* (2018.08)

(58) Field of Classification Search
CPC ............. H05K 13/0452; H05K 13/082; H05K 13/083; H05K 13/0465
(Continued)

(56) References Cited

U.S. PATENT DOCUMENTS 6,317,972 B1 * 11/2001 Asai ............ H05K 13/0812
29/833
2010/0222226 A1 * 9/2010 Ishihara .............. C12Q 1/003
506/9
(Continued)

FOREIGN PATENT DOCUMENTS

CN    1715888 A    1/2006
CN    1901794 A    1/2007
(Continued)

OTHER PUBLICATIONS

An Office Action mailed by the State Intellectual Property Office of the People's Republic of China dated Apr. 2, 2020, which corresponds to Chinese Patent Application No. 201580083291.8 and is related to U.S. Appl. No. 15/759,476.
(Continued)

*Primary Examiner* — Peter Dungba Vo
*Assistant Examiner* — Azm A Parvez
(74) *Attorney, Agent, or Firm* — Studebaker & Brackett PC

(57) ABSTRACT

A component mounting device includes a mounting portion that mounts a component on a bonding material disposed on a substrate, and a measurement unit that measures a state of the bonding material at least after an operation of mounting the component performed by the mounting portion. The component mounting device further includes a control unit that verifies the state of the bonding material based on a measurement result obtained by the measurement unit when defective mounting of the component has occurred.

12 Claims, 7 Drawing Sheets

(58) Field of Classification Search
USPC .......................................... 29/739, 729, 700
See application file for complete search history.

(56) References Cited

U.S. PATENT DOCUMENTS

| | | | | |
|---|---|---|---|---|
| 2010/0321487 | A1* | 12/2010 | Endo | H05K 13/041 348/87 |
| 2012/0151756 | A1* | 6/2012 | Amano | H05K 13/0404 29/720 |
| 2014/0200700 | A1* | 7/2014 | Kamioka | H05K 13/0817 700/110 |

FOREIGN PATENT DOCUMENTS

| | | | |
|---|---|---|---|
| CN | 101506616 A | | 8/2009 |
| CN | 101517356 A | | 8/2009 |
| CN | 103314286 A | | 9/2013 |
| CN | 104685429 A | | 6/2015 |
| JP | 3055161 B2 | | 6/2000 |
| JP | 2003-008295 A | | 1/2003 |
| JP | 2006-339445 A | | 12/2006 |
| JP | 2007-511094 A | | 4/2007 |
| JP | 2007-214460 A | | 8/2007 |
| JP | 2008-098411 A | | 4/2008 |
| JP | 2008-103426 A | | 5/2008 |
| JP | 2008-516453 A | | 5/2008 |
| JP | 2008-300526 A | | 12/2008 |
| JP | 2008300526 A | * | 12/2008 |
| JP | 2014-093390 A | | 5/2014 |
| JP | 2014-216621 A | | 11/2014 |
| JP | 2015-079933 A | | 4/2015 |
| WO | 2014/080525 A1 | | 5/2014 |

OTHER PUBLICATIONS

An Office Action mailed by the State Intellectual Property Office of the People's Republic of China dated Jul. 29, 2019, which corresponds to Chinese Patent Application No. 201580083291.8 and is related to U.S. Appl. No. 15/759,476.

International Search Report issued in PCT/JP2015/079085; dated Jan. 19, 2016.

Written Opinion issued in PCT/JP2015/079085; dated Jan. 19, 2016.

An Office Action mailed by the China National Intellectual Property Administration dated Jul. 27, 2020, which corresponds to Chinese Patent Application No. 201580083291.8 and is related to U.S. Appl. No. 15/759,476.

An Office Action mailed by the Japanese Patent Office dated Oct. 30, 2018, which corresponds to Japanese Patent Application No. 2017-545041 and is related to U.S. Appl. No. 15/759,476.

An Office Action mailed by the China National Intellectual Property Administration dated Dec. 11, 2020, which corresponds to Chinese Patent Application No. 201580083291.8 and is related to U.S. Appl. No. 15/759,476.

* cited by examiner

HEIGHT MEASUREMENT

FIG.7
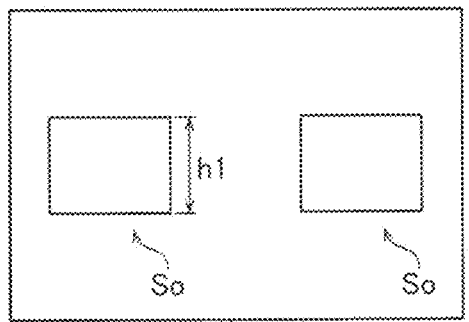
SOLDER BEFORE MOUNTING OPERATION
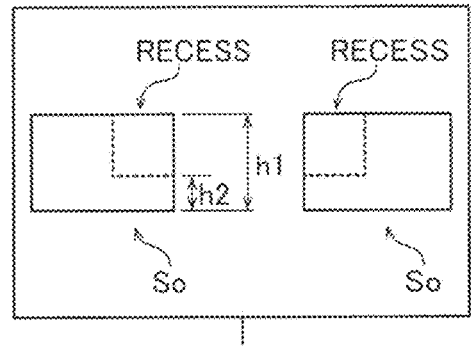
SOLDER AFTER MOUNTING OPERATION (WITH DEFORMATION)
HEIGHT CHANGE BEFORE AND AFTER MOUNTING OPERATION
FIG.8
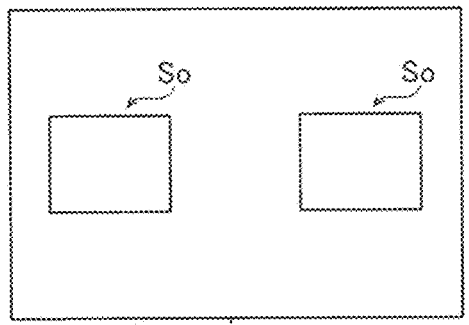
SOLDER BEFORE MOUNTING OPERATION
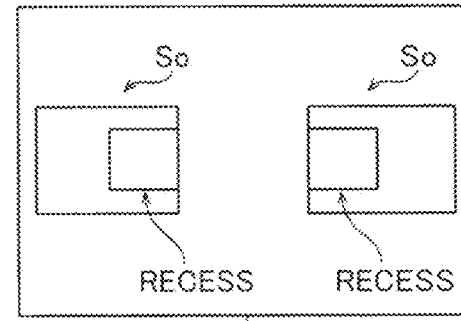
SOLDER AFTER MOUNTING OPERATION (WITH DEFORMATION)
DIFFERENCE IMAGE BEFORE AND AFTER MOUNTING OPERATION

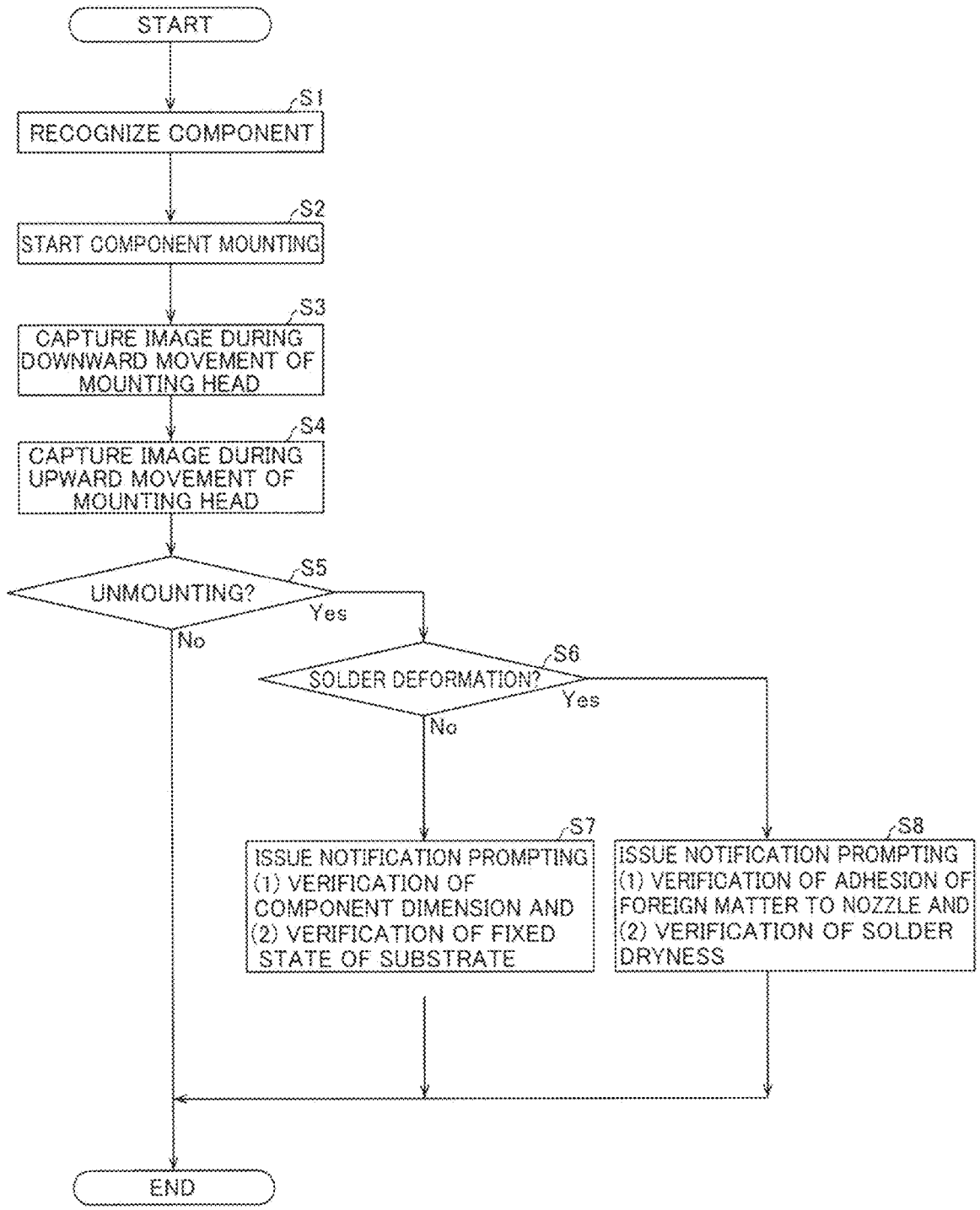

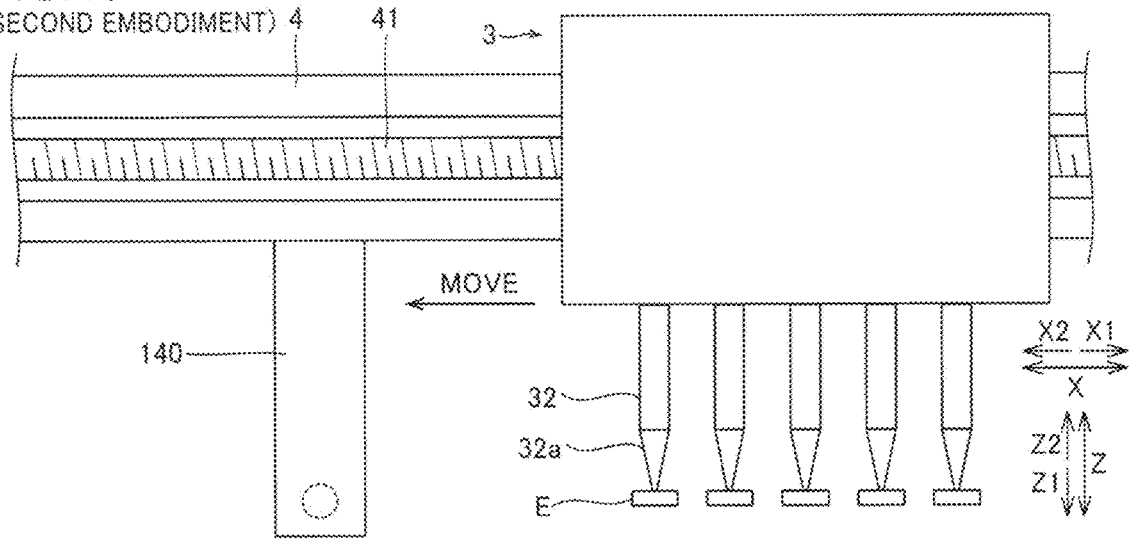
FIG.10 (SECOND EMBODIMENT)
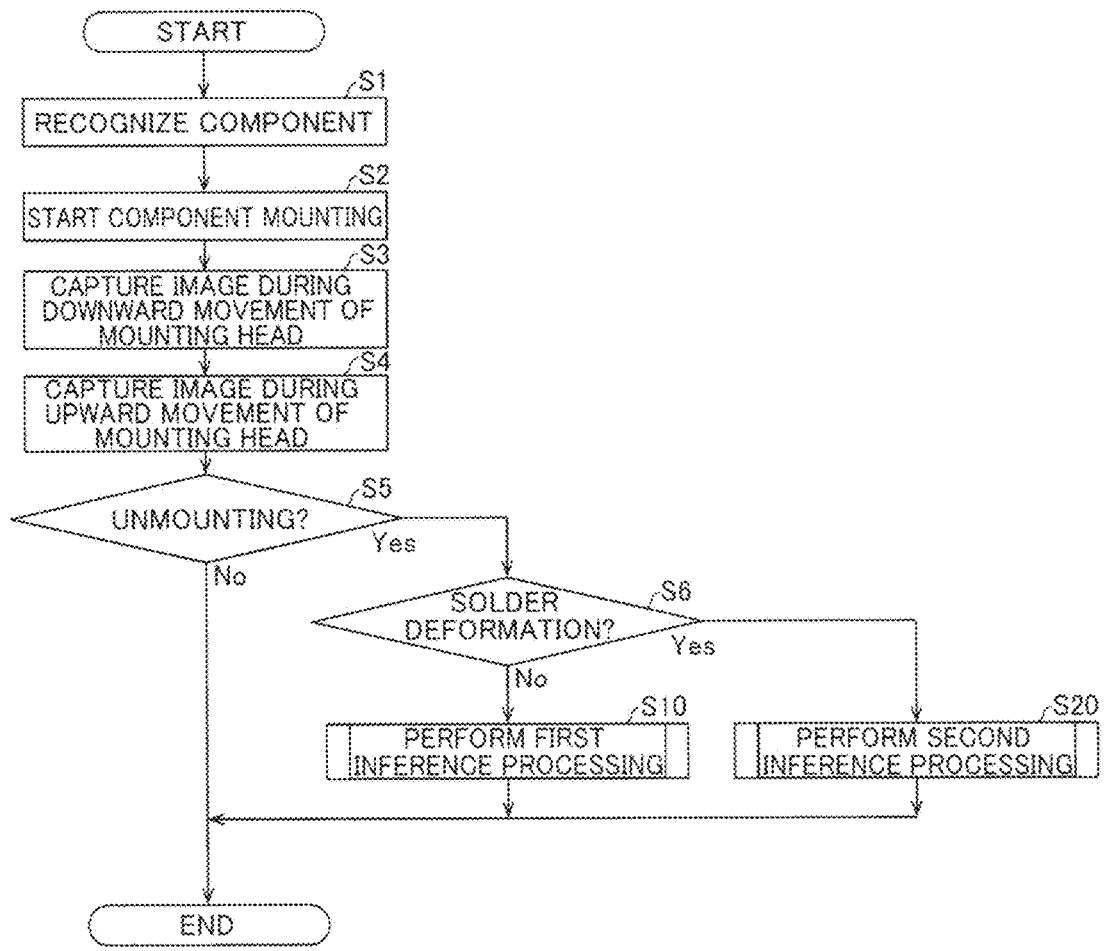
FIG.11 DEFECT CAUSE INFERENCE PROCESSING (SECOND EMBODIMENT)

COMPONENT MOUNTING DEVICE

CROSS-REFERENCE TO RELATED APPLICATION

This application is a National Stage of International Patent Application No. PCT/JP2015/079085, filed Oct. 14, 2015, the entire content of which is incorporated herein by reference.

BACKGROUND

Technical Field

The present disclosure relates to a component mounting device, and more particularly, it relates to a component mounting device that mounts a component on a bonding material arranged on a substrate.

Background Art

In general, a component mounting device that mounts a component on a bonding material arranged on a substrate is known, as described in Japanese Patent Laying-Open No. 2008-98411, for example).

The aforementioned Japanese Patent Laying-Open No. 2008-98411 discloses a surface mounter (component mounting device) including a suction nozzle that suctions a component and mounts the component on a reflow solder (bonding material) arranged on a printed board and an imaging device that performs imaging at least one time in each of a step of suctioning the component and a step of mounting the component. This surface mounter is configured to be capable of displaying image data as an imaging result when defective component mounting has occurred. Thus, this surface mounter is configured to allow a user to verify whether defective component mounting has occurred due to the step of suctioning the component or the step of mounting the component.

SUMMARY

However, although the surface mounter described in the aforementioned Japanese Patent Laying-Open No. 2008-98411 displays the image data as the imaging result when defective component mounting has occurred to allow the user to verify whether or not defective component mounting has occurred due to the step of suctioning the component or the step of mounting the component, it is necessary for the user to investigate a cause of defective component mounting. Thus, there is such a problem that a heavy burden is placed on the user to investigate the cause of defective component mounting.

The present disclosure has been proposed in order to solve the aforementioned problem, and an object of the present disclosure is to provide a component mounting device capable of reducing the burden on a user to investigate a cause of defective component mounting.

A component mounting device according to as aspect of the present disclosure includes a mounting portion that mounts a component on a bonding material disposed on a substrate, a measurement unit that measures a state of the bonding material at least after an operation of mounting the component performed by the mounting portion, and a control unit that verifies the state of the bonding material based on a measurement result obtained by the measurement unit when defective mounting of the component has occurred.

The component mounting device according to this aspect of the present disclosure includes the aforementioned control unit. Thus, the state of the bonding material such as a solder can be automatically verified by the control unit when the defective mounting of the component has occurred, and hence as compared with the case where a user verifies the state of the bonding material by themselves, the burden on the user to investigate a cause of the defective mounting of the component can be reduced. Furthermore, the state of the bonding material to be verified when the defective mounting of the component has occurred can be automatically verified by the control unit, and hence regardless of whether the user (operator) is skilled, the cause of the defective mounting of the component can be easily investigated.

In the aforementioned component mounting device according to this aspect, the control unit is preferably configured to infer a cause of the defective mounting of the component based on the state of the bonding material. According to this structure, not only verification of the state of the bonding material but also inference of the cause of the defective mounting of the component can be automatically performed by the control unit, and hence the burden on the user to investigate the cause of the defective mounting of the component can be further reduced.

In this case, the control unit is preferably configured to communicate information on the inferred cause of the defective mounting of the component. According to this structure, regardless of whether the user is skilled, the cause of the defective mounting of the component can be easily investigated based on the communicated information on the cause of the defective mounting of the component.

In the aforementioned structure in which the information on the cause of the defective mounting of the component is communicated, the control unit is preferably configured to verify presence or absence of deformation of the bonding material after the operation of mounting the component performed by the mounting portion as the state of the bonding material, and to communicate information on causes of the defective mounting of the component in a case where there is the deformation of the bonding material and in a case where there is no deformation of the bonding material. According to this structure, in any of these cases where there is deformation of the bonding material such as a solder and where there is no deformation of the bonding material, the cause of the defective mounting of the component can be easily investigated based on the communicated information on the cause of the defective mounting of the component.

In the aforementioned structure in which the information on the cause of the defective mounting of the component is communicated, the control unit is preferably configured to infer the cause of the defective mounting of the component based on at least one of a measurement result of a thickness of the component, a measurement result of warpage of the substrate, a measurement result of presence or absence of foreign matter adhering to the mounting portion, and a measurement result of a degree of dryness of the bonding material in addition to the state of the bonding material, and to communicate the information on the cause of the defective mounting of the component. According to this structure, by using at least one of the measurement result of the thickness of the component, the measurement result of the warpage of the substrate, the measurement result of the presence or absence of foreign matter adhering to the mounting portion, and the measurement result of the degree of dryness of the bonding material, the cause of the defective mounting of the component can be more precisely inferred.

Consequently, the cause of the defective mounting of the component can be more easily investigated based on the cause of the defective mounting of the component more precisely inferred.

In the aforementioned component mounting device according to this aspect, the measurement unit preferably includes a height measurement unit that measures a height of the bonding material, and the control unit is preferably configured to acquire height information of the bonding material based on a measurement result of the height of the bonding material obtained by the height measurement unit, and to verify the state of the bonding material based on the acquired height information of the bonding material. When the defective mounting has occurred although the component has reached the bonding material such as a solder, the height of the bonding material conceivably changes due to deformation of the bonding material, whereas when the defective mounting has occurred without the component reaching the bonding material, the height of the bonding material conceivably does not change due to no deformation of the bonding material. Therefore, the control unit is configured to verify the state of the bonding material based on the height information of the bonding material as described above such that the state of the bonding material can be easily and accurately verified when the defective mounting of the component has occurred.

In this case, the height measurement unit is preferably provided to measure the height of the bonding material before the operation of mounting the component performed by the mounting portion and the height of the bonding material after the operation of mounting the component performed by the mounting portion, and the control unit is preferably configured to verify the state of the bonding material based on a change in the height information of the bonding material before and after the operation of mounting the component performed by the mounting portion. According to this structure, as compared with the case where the state of the bonding material is verified based only on the height information of the bonding material after the operation of mounting the component performed by the mounting portion, the state of the bonding material can be more easily verified based on the change in the height information of the bonding material before and after the operation of mounting the component performed by the mounting portion. Consequently, even the state of a very small bonding material (a bonding material on which a very small component is mounted), the state of which is difficult to verify, can be easily verified.

In the aforementioned component mounting device according to this aspect, the measurement unit preferably includes an imaging portion that images a predetermined region including the bonding material, the imaging portion is preferably configured to image the predetermined region including the bonding material before the operation of mounting the component performed by the mounting portion and the predetermined region including the bonding material after the operation of mounting the component performed by the mounting portion, and the control unit is preferably configured to verify the state of the bonding material based on a change in an imaging result obtained by the imaging portion before and after the operation of mounting the component performed by the mounting portion. Even according to this structure, similarly to the aforementioned case where the state of the bonding material is verified based on the change in the height information of the bonding material, the state of the bonding material can be more easily verified based on the change in the imaging result obtained by the imaging portion before and after the operation of mounting the component performed by the mounting portion. Consequently, even the state of a very small bonding material (a bonding material on which a very small component is mounted), the state of which is difficult to verify, can be easily verified.

In this case, the control unit is preferably configured to verify the state of the bonding material based on a difference image between an image of the predetermined region captured by the imaging portion before the operation of mounting the component performed by the mounting portion and an image of the predetermined region captured by the imaging portion after the operation of mounting the component performed by the mounting portion. According to this structure, when there is a change in the state of the bonding material, the state of the bonding material can be accurately verified by using the fact that a difference occurs between the image of the predetermined region captured by the imaging portion before the operation of mounting the component performed by the mounting portion and the image of the predetermined region captured by the imaging portion after the operation of mounting the component performed by the mounting portion.

In the aforementioned structure in which the state of the bonding material is verified based on the difference image, the control unit is preferably configured to acquire height information of the bonding material based on the imaging result obtained by the imaging portion, and the control unit is preferably configured to verify the state of the bonding material based on the height information of the bonding material in addition to the difference image. According to this structure, the state of the bonding material can be more accurately verified by using not only the difference image but also the height information of the bonding material. Furthermore, it is not necessary to provide a height measurement unit separately from the imaging portion in order to acquire the height information of the bonding material, and hence an increase in the number of parts can be significantly reduced or prevented even when the state of the bonding material is verified based on the height information of the bonding material in addition to the difference image. Consequently, the state of the bonding material can be more accurately verified while an increase in the number of parts is significantly reduced or prevented.

In the aforementioned structure in which the imaging portion images the predetermined region including the bonding material before and after the operation of mounting the component performed by the mounting portion, the control unit is preferably configured to verify whether or not the defective mounting of the component has occurred based on the change in the imaging result obtained by the imaging portion before and after the operation of mounting the component performed by the mounting portion. Also, the control unit is preferably configured to verify the state of the bonding material based on the change in the imaging result obtained by the imaging portion before and after the operation of mounting the component performed by the mounting portion when the defective mounting of the component has occurred. According to this structure, complication of the imaging operation of the imaging portion can be significantly reduced or prevented as compared with the case where an imaging operation for verifying the state of the bonding material is newly performed when the defective mounting of the component has occurred.

In the aforementioned component mounting device according to this aspect, the bonding material preferably includes a solder.

According to the present disclosure, as hereinabove described, the component mounting device capable of reducing the burden on the user to investigate the cause of defective component mounting can be provided.

BRIEF DESCRIPTION OF THE DRAWINGS

FIG. 7 is a plan view for illustrating a method for verifying the presence or absence of deformation of the solder based on a change in the height of the solder before and after the mounting operation of the component mounting device according to the first embodiment of the present disclosure;

FIG. 8 is a diagram for illustrating a method for verifying the presence or absence of deformation of the solder based on a difference image between images captured before and after the mounting operation of the component mounting device according to the first embodiment of the present disclosure;

FIG. 9 is a flowchart for illustrating defect cause inference processing in the component mounting device according to the first embodiment of the present disclosure;

FIG. 10 is a diagram for illustrating a side view camera of a component mounting device according to a second embodiment of the present disclosure;

FIG. 11 is a flowchart for illustrating defect cause inference processing in the component mounting device according to the second embodiment of the present disclosure;

DETAILED DESCRIPTION

Embodiments embodying the present disclosure are hereinafter described on the basis of the drawings.

First Embodiment (Structure of Component Mounting Device)

The structure of a component mounting device 100 according to a first embodiment of the present disclosure is now described with reference to FIGS. 1 to 4.

Figure 1:
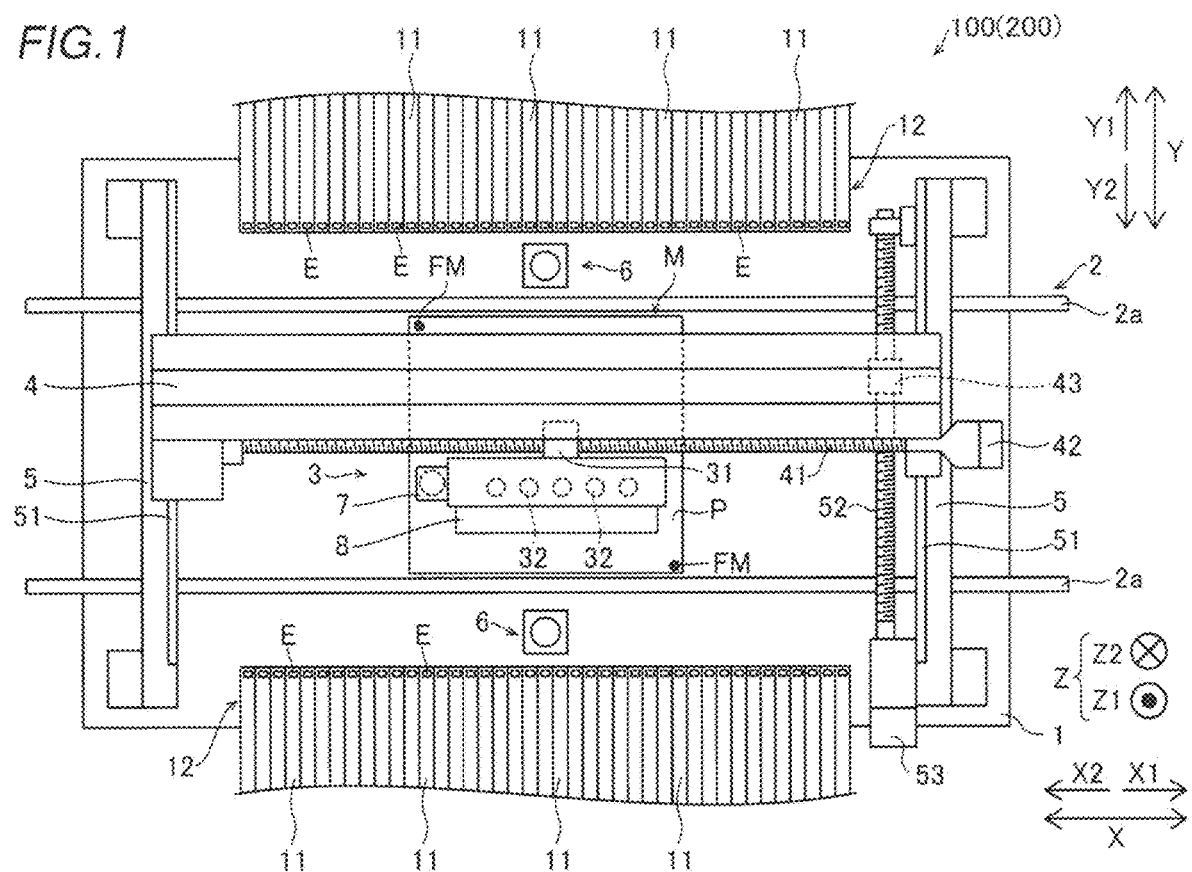
FIG. 1 is a diagram showing the overall structure of a component mounting device according to a first embodiment of the present disclosure.

As shown in FIG. 1, the component mounting device 100 is a device that mounts components E (electronic components), such as ICs, transistors, capacitors, and resistors, on a substrate P such as a printed board. The component mounting device 100 includes a base 1, a conveyance portion 2, a head unit 3, a support 4, rails 5, component recognition cameras 6, a substrate recognition camera 7, an imaging unit 8, a controller 9 (see FIG. 2), and a notification unit 10 (see FIG. 2). The imaging unit 8 is an example of a "measurement unit", a "height measurement unit", or an "imaging portion" in the claims. The controller 9 is an example of a "control unit" in the claims.

Feeder placement portions 12 for arranging a plurality of tape feeders 11 are respectively provided on both ends (a Y1 side and a Y2 side) of the base 1 in a direction Y. The tape feeders 11 hold reels (not shown) on which tapes that hold a plurality of components E at a predetermined interval are wound. The tape feeders 11 are configured to feed the components E from the tips of the tape feeders 11 by rotating the reels to feed the tapes that hold the components E.

The respective tape feeders 11 are placed in the feeder placement portions 12 in a state where the tape feeders 11 are electrically connected to the controller 9 via connectors (not shown) provided in the feeder placement portions 12. Thus, the respective tape feeders 11 are configured to feed the tapes from the reels and feed the components E based on a control signal from the controller 9. At this time, the respective tape feeders 11 are configured to feed the components E according to the mounting operation of the head unit 3.

The conveyance portion 2 includes a pair of conveyors 2a. The conveyance portion 2 has a function of conveying the substrate P in a horizontal direction (direction X) by the pair of conveyors 2a. Specifically, the conveyance portion 2 has a function of carrying in the substrate P before mounting from an upstream (X1 side) conveyance path (not shown), conveying the carried-in substrate P to a mounting operation position M, and carrying out the substrate P, on which mounting has been completed, to a downstream (X2 side) conveyance path (not shown). The conveyance portion 2 is configured to hold and fix the substrate P stopped at the mounting operation position M by a substrate fixing mechanism (not shown) such as a clamping mechanism.

The pair of conveyors 2a of the conveyance portion 2 are configured to be capable of conveying the substrate P in the horizontal direction (direction X) while supporting the substrate P from below. Furthermore, the pair of conveyors 2a are configured such that an interval therebetween in the direction Y can be adjusted. Accordingly, it is possible to adjust the interval between the pair of conveyors 2a in the direction Y according to the size of the substrate P to be carried in.

The head unit 3 is configured to mount a component E at a mounting position Pa (see FIG. 3) on the substrate P fixed at the mounting operation position M. The head unit 3 includes a ball nut 31, five mounting heads 32, five Z-axis motors 33 (see FIG. 2) respectively provided on the five mounting heads 32, and five R-axis motors 34 (see FIG. 2) respectively provided on the five mounting heads 32. The mounting heads 32 are examples of a "mounting portion" in the claims.

The five mounting heads 32 are arranged in a line along the direction X on the lower surface side of the head unit 3. Nozzles 32a (see FIG. 3) are attached to the respective tips of the five mounting heads 32. The mounting heads 32 are configured to be capable of suctioning and holding the components E fed from the tape feeders 11 by a negative pressure generated at the tips of the nozzles 32a by a negative pressure generator (not shown).

Furthermore, the mounting heads 32 are configured to be capable of going up and down in an upward-downward direction (direction Z). Specifically, the mounting heads 32 are configured to be capable of going up and down between a position in a lowered state at the time of suctioning or mounting the component E and a position in a raised state at the time of conveying or imaging the component E. In the head unit 3, each of the five mounting heads 32 is configured to be capable of individually going up and down by a Z-axis motor 33 provided for each mounting head 32. Furthermore, each of the five mounting heads 32 is configured to be individually rotatable about the central axis (about the direction Z) of a nozzle 32a by an R-axis motor 34 provided for each mounting head 32.

The head unit 3 is configured to be movable in the direction X along the support 4. Specifically, the support 4 includes a ball screw shaft 41, an X-axis motor 42 that rotates the ball screw shaft 41, and a guide rail (not shown) that extends in the direction X. The ball screw shaft 41 is rotated by the X-axis motor 42 such that the head unit 3 can move in the direction X along the support 4 together with the ball nut 31 engaged with the ball screw shaft 41 (into which the ball screw shaft 41 is screwed).

The support 4 is configured to be movable in the direction Y perpendicular to the direction X along a pair of rails 5 fixed on the base 1. Specifically, the rails 5 include a pair of guide rails 51 that support both ends of the support 4 in the direction X such that the support 4 is movable in the direction Y, a ball screw shaft 52 that extends in the direction Y, and a Y-axis motor 53 that rotates the ball screw shaft 52. Furthermore, the support 4 is provided with a ball nut 43 engaged with the ball screw shaft 52 (into which the ball screw shaft 52 is screwed). The ball screw shaft 52 is rotated by the Y-axis motor 53 such that the support 4 can move in the direction Y along the pair of rails 5 together with the ball nut 43 engaged with the ball screw shaft 52 (into which the ball screw shaft 52 is screwed).

According to this structure, the head unit 3 is configured to be movable on the base 1 in the horizontal direction (the direction X and the direction Y). Thus, the head unit 3 can move above the tape feeders 11, for example, and can suction the component E fed from the tape feeders 11. Furthermore, the head unit 3 can move above the fixed substrate P at the mounting operation position M, for example, and can mount the suctioned component E on the substrate P.

The component recognition cameras 6 are configured to image the components E suctioned by the mounting heads 32 in order to recognize the suction states of the components E prior to mounting of the components E. The component recognition cameras 6 are fixed on the upper surface of the base 1 and are configured to image the components E suctioned by the mounting heads 32 from below (direction Z2) the components E. These imaging results are acquired by the controller 9. Thus, the controller 9 can recognize the suction states (the rotational orientations and the suction positions with respect to the mounting heads 32) of the components E based on the imaging results of the suctioned components E.

The substrate recognition camera 7 is configured to image position recognition marks (fiducial marks) FM provided on the substrate P prior to mounting of the components E. The position recognition marks FM are marks for recognizing the position of the substrate P. On the substrate P shown in FIG. 1, a pair of position recognition marks FM are provided at a lower right position and an upper left position on the substrate P. The imaging result of these position recognition marks FM is acquired by the controller 9. Then, the controller 9 can recognize the accurate position and orientation of the substrate P fixed by the substrate fixing mechanism (not shown) based on the imaging result of the position recognition marks FM.

Furthermore, the substrate recognition camera 7 is mounted on an X2-side portion of the head unit 3, and is configured to be movable on the base 1 in the direction X and the direction Y together with the head unit 3. The substrate recognition camera 7 is configured to move on the base 1 in the horizontal direction (the direction X and the direction Y) and image the position recognition marks FM provided on the substrate P from above (direction Z1) the substrate P.

Figure 3:
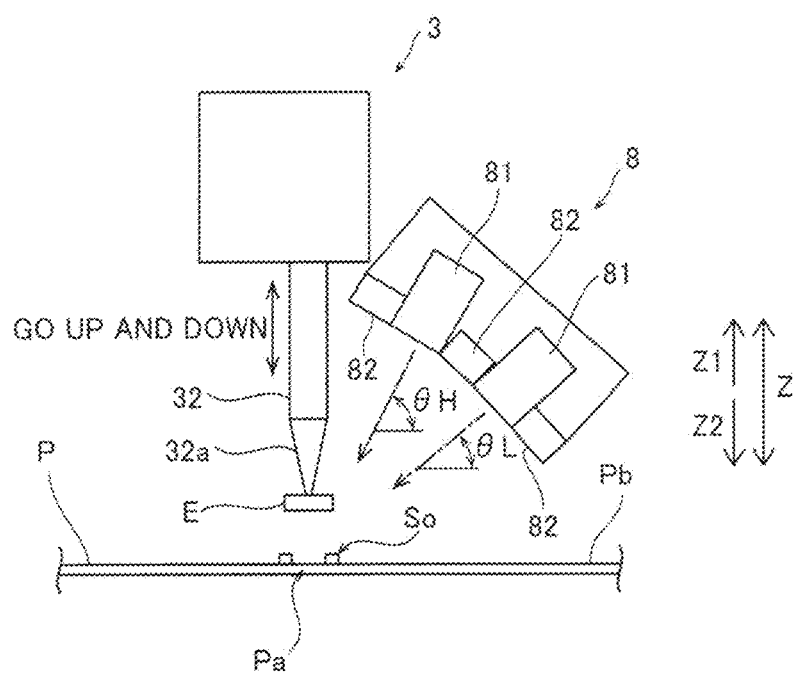
FIG. 3 is a side elevational view for illustrating an imaging unit of the component mounting device according to the first embodiment of the present disclosure.

As shown in FIGS. 1 and 3, the imaging unit 8 is configured to be capable of imaging the substrate P. Specifically, the imaging unit 8 is configured to be capable of imaging a predetermined region including the mounting position Pa on the substrate P in order to perform height measurement. At the mounting position Pa, a solder So for bonding the component E to the substrate P is arranged. Therefore, the imaging unit 8 is configured to image a predetermined region including the solder So by imaging the predetermined region including the mounting position Pa on the substrate P. The solder So is an example of a "bonding material" in the claims.

The imaging unit 8 includes a plurality of height measurement cameras 81 and a plurality of illumination sections 82. According to the first embodiment, the imaging unit 8 is provided with two height measurement cameras 81 and three illumination sections 82 for each mounting head 32.

As shown in FIG. 3, the two height measurement cameras 81 are configured to be capable of imaging the predetermined region including the mounting position Pa on the substrate P from different imaging directions from each other. Specifically, a height measurement camera 81 on the upper side (Z1 side) is configured to be capable of imaging the predetermined region including the mounting position Pa on the substrate P from an imaging direction inclined at an inclination angle θH (0 degrees<θH<90 degrees) with respect to a horizontal plane (a plane substantially parallel to a substrate surface Pb on which the component E is mounted). In addition, a height measurement camera 81 on the lower side (Z2 side) is configured to be capable of imaging the predetermined region including the mounting position Pa on the substrate P from an imaging direction inclined at an inclination angle θL (0 degrees<θL<θH) with respect to the horizontal plane (the plane substantially parallel to the substrate surface Pb on which the component E is mounted).

Thus, the imaging unit 8 is configured to be capable of imaging the predetermined region including the mounting position Pa from a plurality of imaging directions inclined with respect to the substrate surface Pb of the substrate P. The imaging results of the predetermined region including the mounting position Pa are acquired by the controller 9. Then, the controller 9 acquires height information such as the height information of the solder So described below through stereo matching based on the two imaging results of the predetermined region including the mounting position Pa from the two imaging directions.

A height measurement method through stereo matching is now described with reference to FIG. 4.

Figure 4:
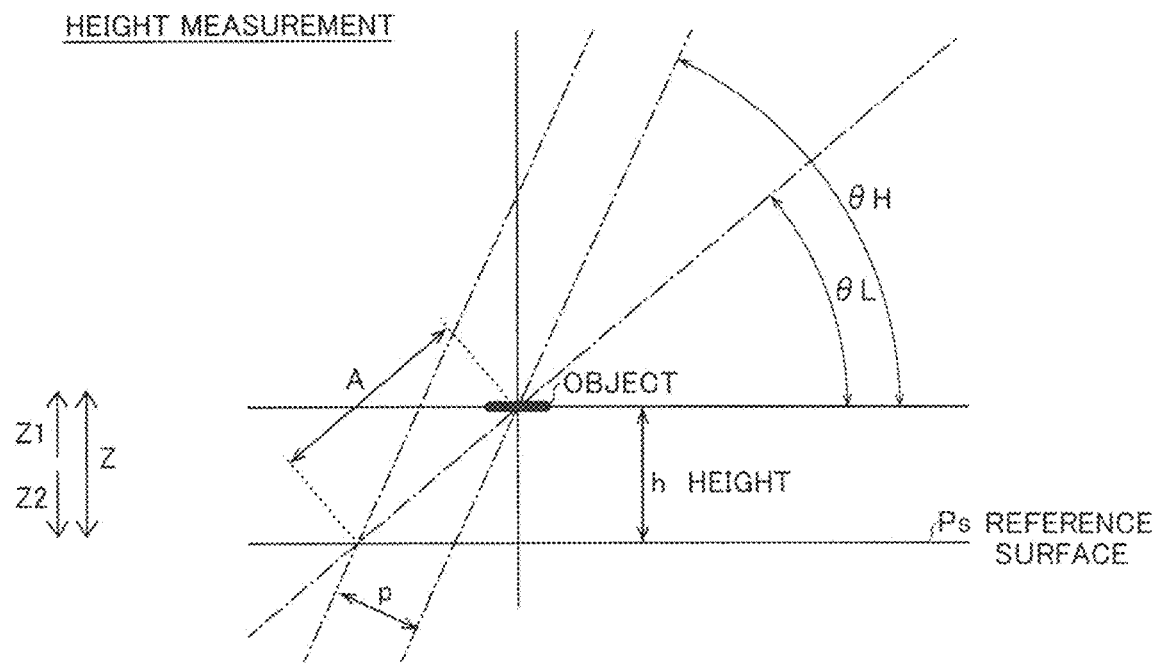
FIG. 4 is a diagram for illustrating a height calculation method through stereo matching in the component mounting device according to the first embodiment of the present disclosure.

As shown in FIG. 4, the predetermined region including an object, the height information of which is acquired, such as the solder So is imaged substantially simultaneously from the two imaging directions with the inclination angle θH and the inclination angle θL by the two height measurement cameras 81. Then, stereo matching between the image captured from the imaging direction with the inclination angle θH and the image captured from the imaging direction with the inclination angle θL is performed such that a parallax p (pixel) between the two captured images is obtained. Here, assuming that the camera resolution of the height measurement cameras 81 is R (μm/pixel), a distance A (μm) is obtained from the following expression (1):

$$A = p \times R / \sin(\theta H - \theta L) \qquad (1).$$

In addition, the height h (μm) of the object with respect to a reference surface Ps is obtained from the following expression (2) using the distance A obtained from the expression (1):

$$h = A \times \sin(\theta L) \qquad (2).$$

Thus, the height information of the solder So, for example, with respect to the reference surface Ps is acquired by the controller 9.

As the height information, any information may be used so far as the same is information that correlates with the height h. For example, information of the height h shown in FIG. 4 may be used as the height information, or information of the distance A that correlates with the height h or information such as information of the parallax p may be used as the height information. In addition, a method for acquiring the height information through stereo matching is not restricted to the above example, but any method may be used.

The illumination sections 82 are provided in the vicinity of the height measurement cameras 81 and are configured to emit light when the height measurement cameras 81 capture images. In addition, the illumination sections 82 each include a light source such as an LED (light-emitting diode).

As shown in FIG. 1, the imaging unit 8 is mounted on a Y2-side portion of the head unit 3. Thus, the imaging unit 8 is configured to be movable on the base 1 in the horizontal direction (the direction X and the direction Y) together with the head unit 3 (mounting heads 32).

Figure 2:
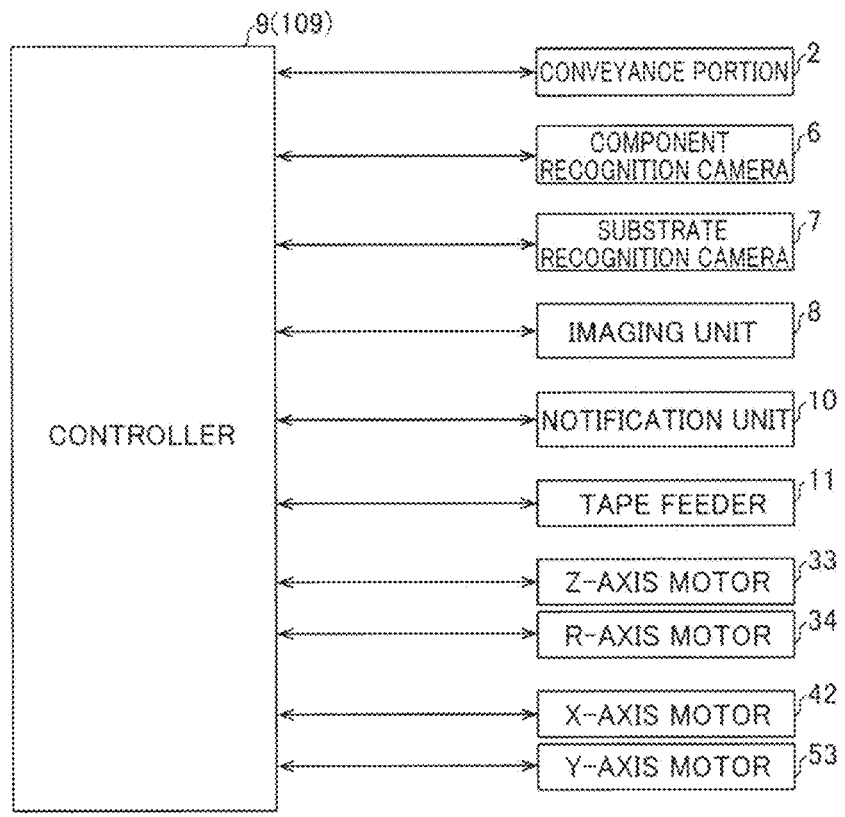
FIG. 2 is a block diagram showing the control structure of the component mounting device according to the first embodiment of the present disclosure.

As shown in FIG. 2, the controller 9 includes a CPU (central processing unit), a ROM (read only memory), a RAM (random access memory), etc., and is configured to control the operation of the component mounting device 100. Specifically, the controller 9 controls the conveyance portion 2, the X-axis motor 42, the Y-axis motor 53, the Z-axis motor 33, the R-axis motor 34, etc. according to programs stored in advance to mount the components E on the substrate P.

More specifically, the controller 9 moves the head unit 3 above the tape feeders 11, generates a negative pressure at the nozzles 32a of the mounting heads 32 by the negative pressure generator (not shown), and controls the nozzles 32a to suction the components E fed from the tape feeders 11.

Then, the controller 9 moves the head unit 3 from above the tape feeders 11 to above the substrate P in order to mount the suctioned components E on the substrate P. During this movement, the controller 9 moves the head unit 3 such that the head unit 3 passes above the component recognition cameras 6, and controls the component recognition cameras 6 to image the components E suctioned by the respective mounting heads 32. Then, when the head unit 3 reaches above the substrate P fixed at the substrate operation position M, the controller 9 moves the heads 32 down, and mounts the suctioned components E on the substrate P by stopping supply of a negative pressure to the heads 32 at the predetermined timing. The notification unit 10 includes a display and is configured to notify a user of information on defective mounting described below, for example, by displaying the information.

(Defective Component Mounting)

Defective mounting of the component E (unmounting of the component E) is now described with reference to FIG. 5. When the component E has been unmounted, there are two possible cases where the component E has been unmounted although the component E has reached the solder So and where the component E has been unmounted without reaching the solder So.

First, the case where the component E has been unmounted although the component E has reached the solder So is described. As shown in view (A1) of FIG. 5, in order to mount the component E on the solder So arranged on the substrate P, the mounting head 32 that has suctioned the component E moves down to the solder So on the substrate P. Then, as shown in view (B1) of FIG. 5, the component E suctioned by the mounting head 32 reaches the solder So. At this time, the solder So in contact with the component E is deformed so as to widen outwardly by being pushed outward by an amount corresponding to the volume of the component E. Thereafter, as shown in view (C1) of FIG. 5, the component E is not mounted but is brought back such that unmounting of the component E occurs. In this case, the outline of the deformed solder So widens outwardly as compared with that of the original solder So, and a recess is formed in a portion that the component E has contacted.

Next, the case where the component E has been unmounted without reaching the solder So is described. As shown in view (A2) of FIG. 5, in order to mount the component E on the solder So arranged on the substrate P, the mounting head 32 that has suctioned the component E moves down to the solder So on the substrate P. Then, as shown in view (B2) of FIG. 5, the component E suctioned by the mounting head 32 does not reach the solder So, and downward movement of the mounting head 32 is stopped. Thereafter, as shown in view (C2) of FIG. 5, the component E is not mounted but is brought back such that unmounting of the component E occurs. In this case, the solder So remains undeformed and remains original. Therefore, when defective mounting of the component E (unmounting of the component E) has occurred, it can be verified whether the component E has been unmounted although the component E has reached the solder So, or the component E has been unmounted without reaching the solder So by verifying the presence or absence of deformation of the solder.

(Structure of Controller Concerning Defective Component Mounting)

<Notification of Information on Cause of Defective Component Mounting>

According to the first embodiment, the controller 9 is configured to verify the state of the solder So based on the imaging result obtained by the imaging unit 8 when unmounting of the component E has occurred. According to the first embodiment, the controller 9 is configured to infer a cause of unmounting of the component E based on the state of the solder So and to control the notification unit 10 to communicate the information on the inferred cause of unmounting of the component E.

Specifically, the controller 9 is configured to verify the presence or absence of deformation of the solder So before and after the operation of mounting the component E performed by the mounting head 32 as the state of the solder So. Furthermore, the controller 9 is configured to control the notification unit 10 to communicate the information on causes of unmounting of the component E in the case where there is deformation of the solder So and in the case where there is no deformation of the solder So.

More specifically, as shown in FIG. 9, the controller 9 is configured to control the notification unit 10 to issue a notification prompting "verification of adhesion of foreign matter to the nozzle" and "verification of solder dryness" as the information on the cause of unmounting of the component E when there is deformation of the solder So. When there is deformation of the solder So, conceivably, the component E has been unmounted although the component E has reached the solder So, as described above. In this case, unmounting of the component E in which the component E has been brought back although the component E has reached the solder So is conceivably attributed to adhesion of foreign matter, such as an adhesive or the solder So, to the nozzle 32a of the mounting head 32, and/or dryness of the solder So disposed on the substrate P. Therefore, when there is deformation of the solder So, a notification prompting "verification of adhesion of foreign matter to the nozzle" and "verification of solder dryness" is issued as the information on the cause of unmounting of the component E.

The controller 9 is configured to control the notification unit 10 to issue a notification prompting "verification of the component dimension" and "verification of the fixed state of the substrate" as the information on the cause of unmounting of the component E when there is no deformation of the solder So. When there is no deformation of the solder So, conceivably, the component E has been unmounted without reaching the colder So, as described above. In this case, unmounting of the component E in which the component E has been brought back without reaching the solder So is conceivably attributed to an error in the dimension (thickness) of the component E set in advance (the dimension set to be smaller than the actual dimension), and/or downward warpage of the substrate P resulting from improper support of the substrate P by back-up pins (not shown) that support the substrate P from below at the mounting operation position M. Therefore, when there is no deformation of the solder So, a notification prompting "verification of the component dimension" and "verification of the fixed state of the substrate" is issued as the information on the cause of unmounting of the component E.

<Verification of Presence or Absence of Deformation of Solder>

According to the first embodiment, the controller 9 is configured to control the imaging unit 8 to image the predetermined region including the mounting position Pa (solder So) during downward movement of the mounting head 32 before the operation of mounting the component E performed by the mounting head 32 and during upward movement of the mounting head 32 after the operation of mounting the component E performed by the mounting head 32.

The controller 9 is configured to verify the state of the solder So (the presence or absence of deformation of the solder So) based on a difference between the imaging result obtained by the imaging unit 8 during downward movement of the mounting head 32 before the operation of mounting the component E performed by the mounting head 32 and the imaging result obtained by the imaging unit 8 during upward movement of the mounting head 32 after the operation of mounting the component E performed by the mounting head 32. Specifically, the controller 9 is configured to verify the state of the solder So based on a change in the imaging result before and after the operation of mounting the component E performed by the mounting head 32 by at least one of the following three means.

First, a means using the solder So height measurement result obtained by the imaging unit 8 is described. In this case, the controller 9 acquires the height information of each of the solder So before the mounting operation and the solder So after the mounting operation through stereo matching based on the imaging result obtained by the imaging unit 8 before the operation of mounting the component E performed by the mounting head 32 and the imaging result obtained by the imaging unit 8 after the operation of mounting the component E performed by the mounting head 32. Then, the controller 9 verifies the state of the solder So based on a change in the height information of the solder So before and after the operation of mounting the component E performed by the mounting head 32.

Figure 6:
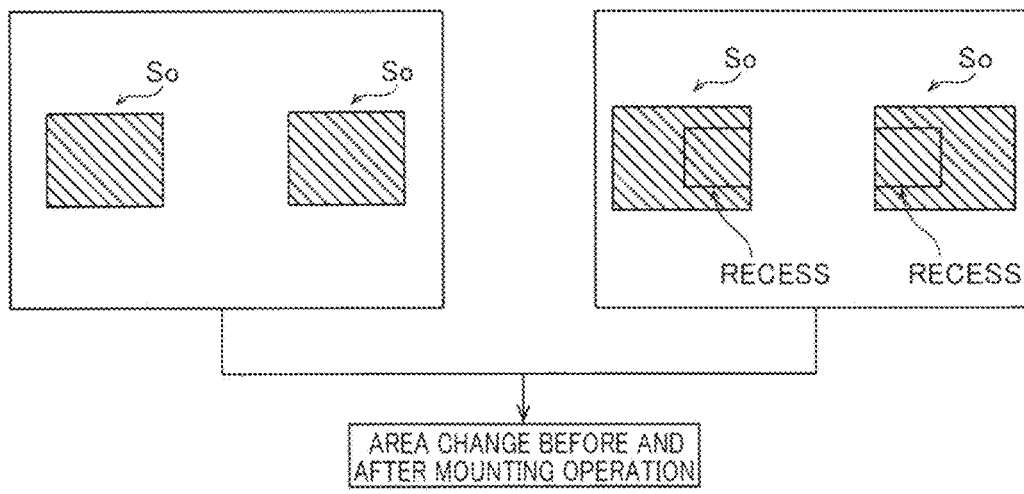
FIG. 6 is a side elevational view for illustrating a method for verifying the presence or absence of deformation of the solder based on a change in the area of the solder before and after the mounting operation of the component mounting device according to the first embodiment of the present disclosure.

Specifically, as shown in FIG. 6, the controller 9 is configured to acquire a change in the area of a portion having a height corresponding to the thickness of the solder So (roughly, the area of the upper surface of the solder So) (shown by hatching) of the height information, and to verify the state of the solder So based on the acquired area change. That is, the controller 9 is configured to verify the presence or absence of deformation of the solder So before and after the operation of mounting the component E performed by the mounting head 32 by determining whether or not the area of the portion having a height corresponding to the thickness of the solder So of the height information of the solder So after the mounting operation is larger than the area of the portion having a height corresponding to the thickness of the solder So of the height information of the solder So before the mounting operation. Incidentally, the area of the portion having a height corresponding to the thickness of the solder So of the height information of the solder So after the mounting operation also includes the area of the recess of the deformed solder So.

Figure 5:
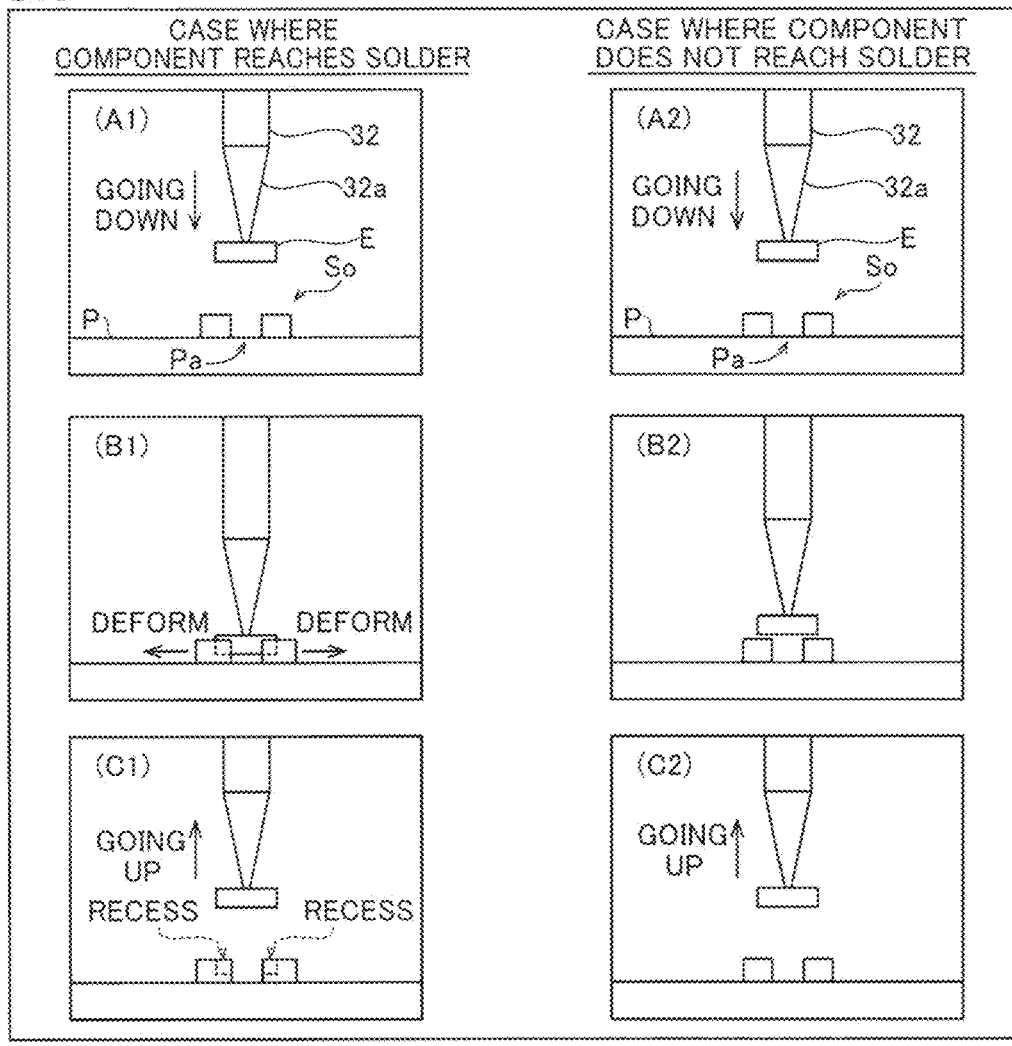
FIG. 5 is a plan view for illustrating a case where a component has been unmounted although the component has reached a solder and a case where the component has been unmounted without reaching the solder.

As shown in FIGS. 5 and 6, when there is deformation of the solder So, the outline of the deformed solder So widens outwardly as compared with that of the original solder So, and hence the area of the portion having a height corresponding to the thickness of the solder So of the height information increases. By using this area change, the presence or absence of deformation of the solder So before and after the operation of mounting the component E performed by the mounting head 32 can be verified.

Next, the other means using the solder So height measurement result obtained by the imaging unit 8 is described. In this case, the controller 9 acquires the height information of the solder So before the mounting operation and the height information of the solder So after the mounting operation through stereo matching based on the imaging result obtained by the imaging unit 8 before the operation of mounting the component E performed by the mounting head 32 and the imaging result obtained by the imaging unit 8 after the operation of mounting the component E performed by the mounting head 32. Then, the controller 9 verifies the state of the solder So based on a change in the height information of the solder So before and after the operation of mounting the component E performed by the mounting head 32.

Specifically, as shown in FIG. 7, the controller 9 is configured to acquire a change in the height in the vicinity of the solder So (the thickness of the solder So) of the height information and to verify the state of the solder So based on the acquired height change. That is, the controller 9 is configured to verify the presence or absence of deformation of the solder So before and after the operation of mounting the component E performed by the mounting head 32 by determining whether or not the height in the vicinity of the solder So of the height information of the solder So after the mounting operation is smaller than the height in the vicinity of the solder So of the height information of the solder So before the mounting operation.

As shown in FIGS. 5 and 7, when there is deformation of the solder So, a slight recess is formed in the deformed solder So as compared with the original solder So. Therefore, whereas the entire original solder So has a height h1 (original height), the deformed solder So includes a portion having a height h1 (portion having an original height) and a portion (recess) having a height h2 smaller than the height h1 such that the height in the vicinity of the solder So decreases as a whole. By using this height change, the presence or absence of deformation of the solder So before and after the operation of mounting the component E performed by the mounting head 32 can be verified.

Next, a means using the image captured by the imaging unit 8 is described. In this case, as shown in FIG. 8, the controller 9 acquires a difference image between the captured image of the predetermined region including the solder So before the operation of mounting the component E performed by the mounting head 32 and the captured image of the predetermined region including the solder So after the operation of mounting the component E performed by the mounting head 32. The controller 9 also acquires the height information of the solder So after the mounting operation through stereo matching based on the imaging result obtained by the imaging unit 8 after the operation of mounting the component E performed by the mounting head 32. Then, the controller 9 verifies the state of the solder So based on the acquired difference image and the acquired height information of the solder So.

Specifically, the controller 9 is configured to determine whether or not there is a certain amount of difference change in the difference image before and after the mounting operation based on the acquired difference image. Furthermore, the controller 9 is configured to determine whether or not a height corresponding to the thickness of the component E is acquired based on the height information of the solder So when there is a certain amount of difference change in the difference image before and after the mounting operation. That is, the controller 9 is configured to verify the presence or absence of deformation of the solder So before and after the operation of mounting the component E performed by the mounting head 32 by determining whether or not there is a certain amount of difference change in the difference image before and after the mounting operation and determining whether or not the height corresponding to the thickness of the component E is acquired.

As shown in FIGS. 5 and 8, when there is deformation of the solder So, the outline of the deformed solder So widens outwardly as compared with that of the original solder So. Therefore, a certain amount of difference change occurs in the difference image before and after the mounting operation. When unmounting of the component E has occurred, the component E is not mounted on the solder So, and hence the height corresponding to the thickness of the component E is not acquired. By using these, the presence or absence of deformation of the solder So before and after the operation of mounting the component E performed by the mounting head 32 can be verified. Incidentally, these three means may be used alone or in combination.

<Verification of Defective Component Mounting>

According to the first embodiment, the controller 9 is configured to verify whether or not unmounting of the component E has occurred based on a change in the imaging result obtained by the imaging unit 8 before and after the operation of mounting the component E performed by the mounting head 32. The controller 9 is configured to verify whether or not unmounting of the component E has occurred based on a change in the captured image due to mounting of the component E at the mounting position Pa or a change in the height information due to mounting of the component E at the mounting position Pa, for example.

(Defect Cause Inference Processing)

Defect cause inference processing according to the first embodiment is now described based on a flowchart with reference to FIG. 9. The defect cause inference processing is performed by the controller 9.

As shown in FIG. 9, first, in step S1, either of the component recognition cameras 6 images the component E suctioned by the head 32, and the suction state of the component E is recognized based on this imaging result. Thereafter, the head unit 3 is moved from above either of the component recognition cameras 6 to above the substrate P.

Then, when the head unit 3 reaches above the substrate P, the operation of mounting the component E on the substrate P is started in step S2.

Then, in step S3, the mounting head 32 that has suctioned the component E is moved down toward the mounting position Pa, and the predetermined region including the mounting position Pa (solder So) before the mounting operation is imaged by the imaging unit 8 during downward movement of the mounting head 32.

Then, in step S4, the mounting head 32 is moved up from the mounting position Pa, and the predetermined region including the mounting position Pa (solder So) after the mounting operation is imaged by the imaging unit 8 during upward movement of the mounting head 32.

Then, in step S5, the controller 9 determines whether or not unmounting of the component E has occurred based on a difference between the imaging result obtained by the imaging unit 8 in step S3 and the imaging result obtained by the imaging unit 8 in step S4. When the controller 9 determines that unmounting of the component E has not occurred in step S5, defective mounting of the component E has not occurred, and hence the controller 9 terminates the defect cause inference processing. When determining that unmounting of the component E has occurred in step S5, the controller 9 advances to step S6.

Then, in step S6, the controller 9 determines whether or not there is deformation of the solder So (the presence or absence of deformation of the solder So) based on a difference between the imaging result obtained by the imaging unit 8 in step S3 and the imaging result obtained by the imaging unit 8 in step S4. When determining that there is no deformation of the solder So in step S6, the controller 9 advances to step S7.

Then, in step S7, a notification prompting "verification of the component dimension" and "verification of the fixed state of the substrate" is displayed as the information on the cause of unmounting of the component E on the notification unit 10 such that the user is notified. Thereafter, the defect cause inference processing is terminated.

When determining that there is deformation of the solder So in step S6, the controller 9 advances to step S8.

Then, in step S8, a notification prompting "verification of adhesion of foreign matter to the nozzle" and "verification of solder dryness" is displayed as the information on the cause of unmounting of the component E on the notification unit 10 such that the user is notified. Thereafter, the defect cause inference processing is terminated.

Effects of First Embodiment

According to the first embodiment, the following effects can be obtained.

According to the first embodiment, as hereinabove described, the component mounting device 100 includes the controller 9 that verifies the state of the solder So based on the measurement result (imaging result) obtained by the imaging unit 8 when defective mounting of the component E (unmounting of the component E) has occurred. Thus, the state of the solder So can be automatically verified by the controller 9 when defective mounting of the component E has occurred, and hence as compared with the case where the user verifies the state of the solder So by themselves, the burden on the user to investigate the cause of defective mounting of the component E can be reduced. Furthermore, the state of the solder So to be verified when defective mounting of the component E has occurred can be automatically verified by the controller 9, and hence regardless of whether the user (operator) is skilled, the cause of defective mounting of the component E can be easily investigated.

According to the first embodiment, as hereinabove described, the controller 9 is configured to infer the cause of defective mounting of the component E based on the state of the solder So. Thus, not only verification of the state of the solder So but also inference of the cause of defective mounting of the component E can be automatically performed by the controller 9, and hence the burden on the user to investigate the cause of defective mounting of the component E can be further reduced.

According to the first embodiment, as hereinabove described, the controller 9 is configured to communicate the information on the inferred cause of defective mounting of the component E. Thus, regardless of whether the user is skilled, the cause of defective mounting of the component E can be easily investigated based on the communicated information on the cause of defective mounting of the component E.

According to the first embodiment, as hereinabove described, the controller 9 is configured to verify the presence or absence of deformation of the solder So after the operation of mounting the component E performed by the mounting head 32 as the state of the solder So and to communicate the information on the causes of defective mounting of the component E in the case where there is deformation of the solder So and in the case where there is no deformation of the solder So. Thus, in any of these cases where there is deformation of the solder So and where there is no deformation of the solder So, the cause of defective mounting of the component E can be easily investigated based on the communicated information on the cause of defective mounting of the component E.

According to the first embodiment, as hereinabove described, the controller 9 is configured to acquire the height information of the solder So based on the solder So height measurement result obtained by the height imaging unit 8 and to verify the state of the solder So based on the acquired height information of the solder So. As shown in FIG. 5, when defective mounting (unmounting) has occurred although the component E has reached the solder So, the height of the solder So conceivably changes due to deformation of the solder So, whereas when defective mounting (unmounting) has occurred without the component E reaching the solder So, the height of the solder So conceivably does not change due to no deformation of the solder So. Therefore, the controller 9 is configured to verify the state of the solder So based on the height information of the solder So as described above such that the state of the solder So can be easily and accurately verified when defective mounting of the component E has occurred.

According to the first embodiment, as hereinabove described, the controller 9 is configured to verify the state of the solder So based on a change in the height information of the solder So before and after the operation of mounting the component E performed by the mounting head 32. Thus, as compared with the case where the state of the solder So is verified based only on the height information of the solder So after the operation of mounting the component E performed by the mounting head 32, the state of the solder So can be more easily verified based on a change in the height information of the solder So before and after the operation of mounting the component E performed by the mounting head 32. Consequently, even the state of a very small solder So (a solder So on which a very small component E is mounted), the state of which is difficult to verify, can be easily verified.

According to the first embodiment, as hereinabove described, the controller 9 is configured to verify the state of the solder So based on a change in the imaging result obtained by the imaging unit 8 before and after the operation of mounting the component E performed by the mounting head 32. Thus, similarly to the aforementioned case where the state of the solder So is verified based on a change in the height information of the solder So, the state of the solder So can be more easily verified based on a change in the imaging result obtained by the imaging unit 8 before and after the operation of mounting the component E performed by the mounting head 32. Consequently, even the state of a very small solder So (a solder So on which a very small component E is mounted), the state of which is difficult to verify, can be easily verified.

According to the first embodiment, as hereinabove described, the controller 9 is configured to verify the state of the solder So based on the difference image between the image of the predetermined region captured by the imaging unit 8 before the operation of mounting the component E performed by the mounting head 32 and the image of the predetermined region captured by the imaging unit 8 after the operation of mounting the component E performed by the mounting head 32. Thus, when there is a change in the state of the solder So, the state of the solder So can be accurately verified by using the fact that a difference occurs between the image of the predetermined region captured by the imaging unit 8 before the operation of mounting the component E performed by the mounting head 32 and the image of the predetermined region captured by the imaging unit 8 after the operation of mounting the component E performed by the mounting head 32.

According to the first embodiment, as hereinabove described, the controller 9 is configured to acquire the height information of the solder So based on the imaging result obtained by the imaging unit 8. Furthermore, the controller 9 is configured to verify the state of the solder So based on the height information of the solder So in addition to the difference image. Thus, the state of the solder So can be more accurately verified by using not only the difference image but also the height information of the solder So. Furthermore, it is not necessary to provide a height measurement unit separately from the imaging unit 8 in order to acquire the height information of the solder So, and hence an increase in the number of parts can be significantly reduced or prevented even when the state of the solder So is verified based on the height information of the solder So in addition to the difference image. Consequently, the state of the solder So can be more accurately verified while an increase in the number of parts is significantly reduced or prevented.

According to the first embodiment, as hereinabove described, the controller 9 is configured to verify whether or not defective mounting of the component E has occurred based on a change in the imaging result obtained by the imaging unit 8 before and after the operation of mounting the component E performed by the mounting head 32. Furthermore, the controller 9 is configured to verify the state of the solder So based on a change in the imaging result obtained by the imaging unit 8 before and after the operation of mounting the component E performed by the mounting head 32 when defective mounting of the component E has occurred. Thus, complication of the imaging operation of the imaging unit 8 can be significantly reduced or prevented as compared with the case where an imaging operation for verifying the state of the solder So is newly performed when defective mounting of the component E has occurred.

Second Embodiment

A second embodiment is now described with reference to FIGS. 1 to 3 and 10 to 13. In this second embodiment, an example in which a cause of defective component mounting is more precisely inferred based on other pieces of information in addition to the structure of the first embodiment described above, in which the cause of defective mounting of the component is inferred based on the state of the solder, is described.

(Structure of Component Mounting Device)

As shown in FIGS. 2 and 10, a component mounting device 200 (see FIG. 1) according to the second embodiment of the present disclosure is different from the component mounting device 100 according to the first embodiment described above in that the component mounting device 200 includes a controller 109 (see FIG. 2) and a side view camera 140. The controller 109 is an example of a "control unit" in the claims. The same structures as those of the first embodiment described above are denoted by the same reference numerals, and description thereof is omitted.

(Structure of Side View Camera)

The side view camera 140 is provided on a support 4 of the component mounting device 200. The side view camera 140 is configured to image a component E suctioned by a mounting head 32 from the side in order to recognize the suction state of the component E from the side prior to mounting of the component E. This imaging result is acquired by the controller 109. Thus, the controller 9 can recognize the suction state of the component E and the thickness of the component E based on the imaging result of the component E imaged from the side.

(Structure of Controller Concerning Defective Component Mounting)

According to the second embodiment, the controller 109 is configured to infer the cause of unmounting of the component E based on the measurement result of the thickness of the component E, the measurement result of warpage of a substrate P, the measurement result of the presence or absence of foreign matter adhering to a nozzle 32a of the mounting head 32, and the measurement result of the degree of dryness of a solder So in addition to the state of the solder So (see FIG. 3), and to communicate information on the cause of unmounting of the component E.

(Defect Cause Inference Processing)

Figure 12:
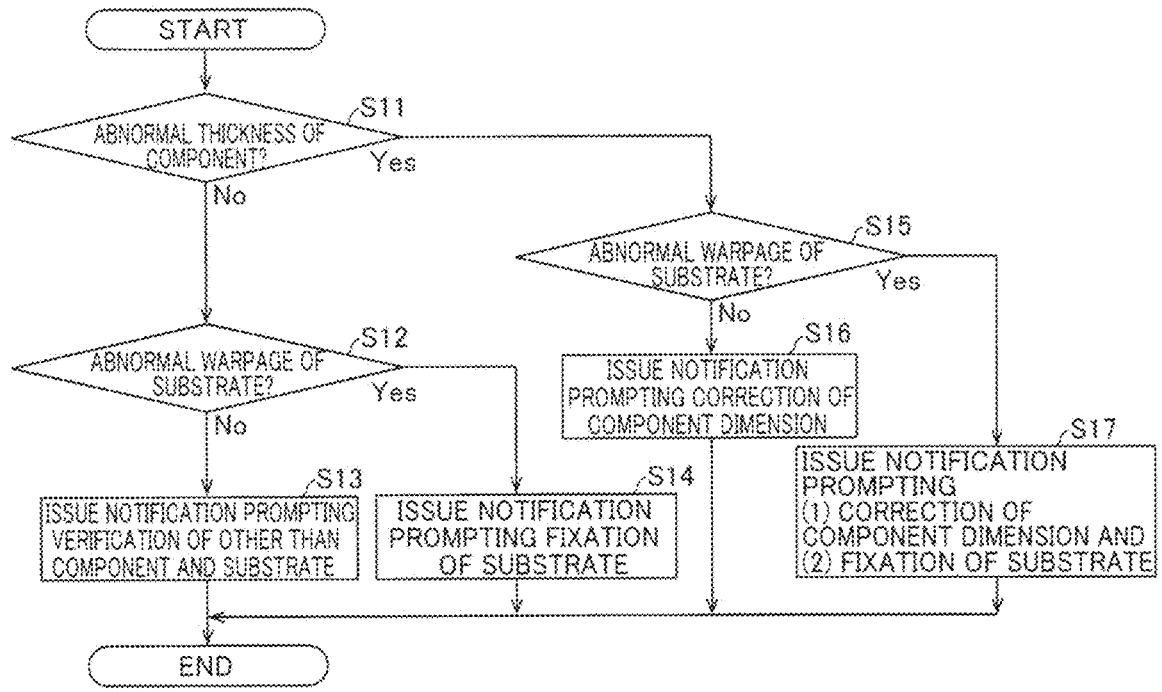
FIG. 12 is a flowchart for illustrating first inference processing in the component mounting device according to the second embodiment of the present disclosure.
Figure 13:
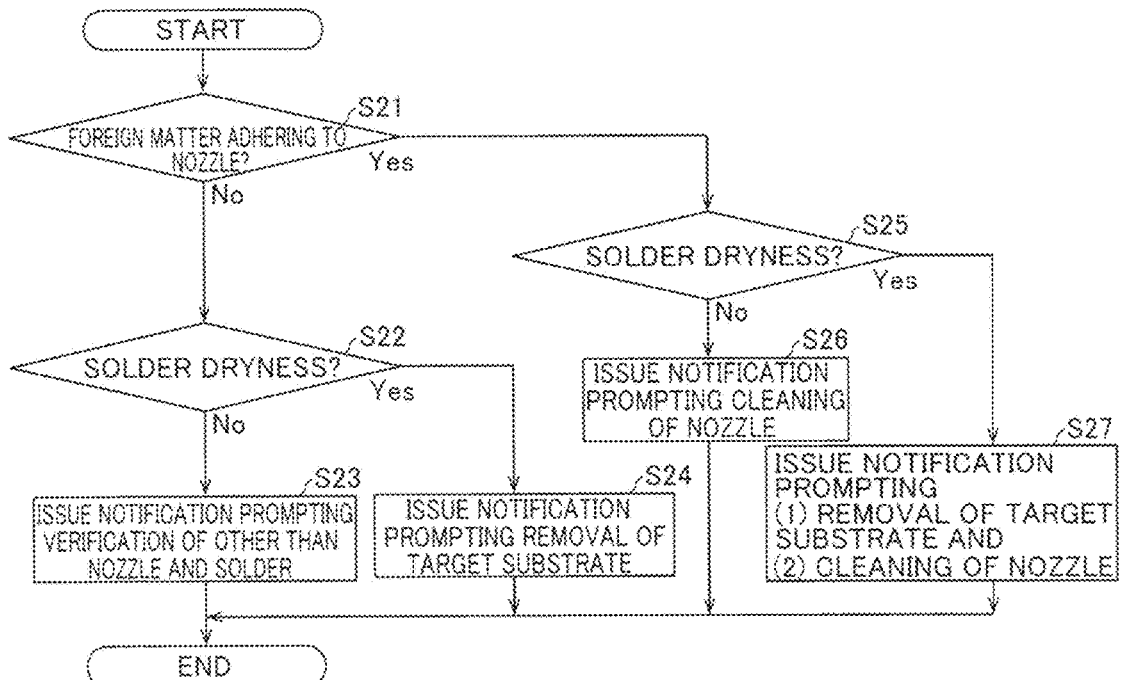
FIG. 13 is a flowchart for illustrating second inference processing in the component mounting device according to the second embodiment of the present disclosure.

Defect cause inference processing according to the second embodiment is now described based on a flowchart with reference to FIGS. 11 to 13. The defect cause inference processing is performed by the controller 109. The same defect cause inference processing operations as those of the first embodiment described above are denoted by the same reference numerals, and description thereof is omitted.

As shown in FIG. 11, first, the processing operations in step S1 to step S5 are performed similarly to the first embodiment described above. Then, when determining that unmounting of the component E has not occurred in step S5, the controller 109 terminates the defect cause inference processing.

When determining that unmounting of the component E has occurred in step S5, the controller 109 advances to step S6. Then, in step S6, the controller 109 determines whether or not there is deformation of the solder So (the presence or absence of deformation of the solder So) based on a difference between an imaging result obtained by an imaging unit 8 in step S3 and an imaging result obtained by the imaging unit 8 in step S4.

When determining that there is no deformation of the solder So in step S6, the controller 109 advances to step S10. In step S10, first inference processing is performed.

In the first inference processing, first, the controller 109 determines whether or not the thickness of the component E is abnormal in step S11, as shown in FIG. 12. Specifically, in step S11, the controller 109 acquires the thickness of the component E (the actual thickness of the component E) suctioned by the mounting head 32 based on the imaging result obtained by the side view camera 140. Then, the controller 109 determines whether or not the thickness of the component E is abnormal based on comparison between the thickness of the component E set in advance (the set thickness of the component E) and the actual thickness of the component E. That is, when there is a difference between the set thickness of the component E and the actual thickness of the component E, the controller 109 determines that the thickness of the component E is abnormal, and when the set thickness of the component E and the actual thickness of the component E are substantially the same as each other, the controller 109 determines that the thickness of the component E is not abnormal.

When determining that the thickness of the component E is not abnormal in step S11, the controller 109 advances to step S12. Then, in step S12, the controller 109 determines whether or not the warpage of the substrate P is abnormal.

Specifically, in step S12, the controller 109 acquires the height information of the substrate surface Pb of the substrate P in the vicinity of a mounting position Pa based on the imaging result obtained by the imaging unit 8 in step S3 or the imaging result obtained by the imaging unit 8 in step S4. Then, the controller 109 determines whether or not the warpage of the substrate P is abnormal based on comparison between a threshold value set in advance and the warpage (downward warpage) of the substrate P based on the acquired height information of the substrate surface Pb. That is, when the warpage (downward warpage) of the substrate P is greater than the threshold value, the controller 109 determines that the warpage of the substrate P is abnormal, and when the warpage (downward warpage) of the substrate P is not greater than the threshold value, the controller 109 determines that the warpage of the substrate P is not abnormal.

When determining that the warpage of the substrate P is not abnormal in step S12, the controller 109 advances to step S13. In this case, the thickness of the component E is conceivably not abnormal, and the warpage of the substrate P is conceivably not abnormal. Thus, in step S13, a notification prompting "verification of other than the component and the substrate" is issued as the information on the cause of unmounting of the component E by a notification unit 10.

When determining that the warpage of the substrate P is abnormal in step S12, the controller 109 advances to step S14. In this case, whereas the thickness of the component E is conceivably not abnormal, the warpage of the substrate P is conceivably abnormal, and hence in step S14, a notification prompting "fixation of the substrate" is issued as the information on the cause of unmounting of the component E by the notification unit 10. That is, the notification unit 10 issues a notification so as to improve back-up pin (not shown) support (fixation) of the substrate P.

When determining that the thickness of the component E is abnormal in step S11, the controller 109 advances to step S15. Then, in step S15, the controller 109 determines whether or not the warpage of the substrate P is abnormal, similarly to the processing operation in step S12.

When determining that the warpage of the substrate P is not abnormal in step S15, the controller 109 advances to step S16. In this case, whereas the warpage of the substrate P is conceivably not abnormal, the thickness of the component E is conceivably abnormal, and hence in step S16, a notification prompting "correction of the component dimension" is issued as the information on the cause of unmounting of the component E by the notification unit 10. That is, the notification unit 10 issues a notification so as to correct the set dimension (thickness) of the component E.

When determining that the warpage of the substrate P is abnormal in step S15, the controller 109 advances to step S17. In this case, both the thickness of the component E and the warpage of the substrate P are conceivably abnormal, and hence in step S17, a notification prompting "correction of the component dimension" and "fixation of the substrate" is issued as the information on the cause of unmounting of the component E by the notification unit 10. Thereafter, as shown in FIG. 11, the defect cause inference processing is terminated.

When determining that there is deformation of the solder So in step S6, the controller 109 advances to step S20. In step S20, second inference processing is performed.

In the second inference processing, first, the controller 109 determines whether or not foreign matter (foreign matter such as an adhesive or the solder) adheres to the nozzle 32a of the mounting head 32 in step S21, as shown in FIG. 13. Specifically, in step S21, first, the mounting head 32 is moved above a component disposal site (not shown) such as a tray, and the component E is removed from the nozzle 32a of the mounting head 32. Then, after the component E is removed, either of component recognition cameras 6 images the nozzle 32a of the mounting head 32 from below. The controller 109 determines whether or not foreign matter adheres to the nozzle 32a of the mounting head 32 based on this imaging result obtained by the component recognition camera 6.

When determining that no foreign matter adheres to the nozzle 32a of the mounting head 32 in step S21, the controller 109 advances to step S22. Then, in step S22, the controller 109 determines whether or not the solder So has dryness (whether or not the solder So is dry).

Specifically, in step S22, first, the controller 109 acquires the printing time at which the solder So has been printed on the substrate P from a printer (not shown) in the previous process, for example. Then, the controller 109 determines whether or not the solder So has dryness based on the acquired printing time. That is, if more than a predetermined time has passed from the printing time, the controller 109 determines that the solder So has dryness, and if the predetermined time or less has passed from the printing time, the controller 109 determines that the solder So has no dryness.

When determining that the solder So has no dryness in step S22, the controller 109 advances to step S23. In this case, no foreign matter conceivably adheres to the nozzle 32a of the mounting head 32, and the solder So conceivably has no dryness. Thus, in step S23, a notification prompting "verification of other than the nozzle and the solder" is issued as the information on the cause of unmounting of the component E by the notification unit 10.

When determining that the solder So has dryness (the solder So is dry) in step S22, the controller 109 advances to step S24. In this case, whereas no foreign matter conceivably adheres to the nozzle 32a of the mounting head 32, the solder So conceivably has dryness, and hence in step S24, a notification prompting "removal of a target substrate" is issued as the information on the cause of unmounting of the component E by the notification unit 10.

When determining that foreign matter adheres to the nozzle 32a of the mounting head 32 in step S21, the controller 109 advances to step S25. Then, in step S25, the controller 109 determines whether or not the solder So has dryness, similarly to the processing operation in step S22.

When determining that the solder So has no dryness in step S25, the controller 109 advances to step S26. In this case, whereas the solder So conceivably has no dryness, foreign matter conceivably adheres to the nozzle 32a of the mounting head 32, and hence in step S26, a notification prompting "cleaning of the nozzle" is issued as the information on the cause of unmounting of the component E by the notification unit 10.

When determining that the solder So has dryness in step S25, the controller 109 advances to step S27. In this case, foreign matter conceivably adheres to the nozzle 32a of the mounting head 32, and the solder So conceivably has dryness. Thus, in step S27, a notification prompting "removal of a target substrate" and "cleaning of the nozzle" is issued as the information on the cause of unmounting of the component E by the notification unit 10. Thereafter, as shown in FIG. 11, the defect cause inference processing is terminated.

The remaining structures of the second embodiment are similar to those of the aforementioned first embodiment.

Effects of Second Embodiment

According to the second embodiment, the following effects can be obtained.

According to the second embodiment, as hereinabove described, the controller 109 is configured to infer the cause of defective mounting of the component E based on the measurement result of the thickness of the component E, the measurement result of the warpage of the substrate P, the measurement result of the presence or absence of foreign matter adhering to the mounting head 32, and the measurement result of the degree of dryness of the solder So in addition to the state of the solder So, and to communicate the information on the cause of defective mounting of the component E. Thus, by using the measurement result of the thickness of the component E, the measurement result of the warpage of the substrate P, the measurement result of the presence or absence of foreign matter adhering to the mounting head 32, and the measurement result of the degree of dryness of the solder So, the cause of defective mounting of the component E can be more precisely inferred. Consequently, the cause of defective mounting of the component E can be more easily investigated based on the cause of defective mounting of the component E more precisely inferred.

The remaining effects of the second embodiment are similar to those of the aforementioned first embodiment.

Modifications

The embodiments disclosed this time must be considered as illustrative in all points and not restrictive. The range of the present disclosure is shown not by the above description of the embodiments but by the scope of claims for patent, and all modifications within the meaning and range equivalent to the scope of claims for patent are further included.

For example, while the example in which the cause of defective component mounting is inferred and the user is notified of the information on the inferred cause of defective component mounting has been shown in each of the aforementioned first and second embodiments, the present disclosure is not restricted to this. According to the present disclosure, the user may not be notified of the information on the inferred cause of defective component mounting. For example, the cause of defective component mounting may be inferred, and the control unit may perform an operation of addressing the cause of defective component mounting based on the inferred cause of defective component mounting.

While the example in which the presence or absence of deformation of the solder before and after the operation of mounting the component performed by the mounting head is verified as the state of the solder has been shown in each of the aforementioned first and second embodiments, the present disclosure is not restricted to this. According to the present disclosure, other than the presence or absence of deformation of the solder before and after the operation of mounting the component performed by the mounting head may be verified as the state of the solder. As the state of the solder, the degree of deformation of the solder (the rate of deformation of the solder, for example) before and after the operation of mounting the component performed by the mounting head may be verified.

While the example in which the imaging unit (imaging portion) is used as the height measurement unit in the claims has been shown in each of the aforementioned first and second embodiments, the present disclosure is not restricted to this. According to the present disclosure, other than the imaging unit (imaging portion) may be used as the height measurement unit in the claims. For example, a height measurement unit such as a displacement sensor may be used.

While the example in which the state of the solder is verified based on a change in the imaging result before and after the operation of mounting the component performed by the mounting head has been shown in each of the aforementioned first and second embodiments, the present disclosure is not restricted to this. According to the present disclosure, the state of the solder may be verified based on the imaging result after the operation of mounting the component performed by the mounting head. For example, the height information of the solder after the mounting operation of the mounting head may be acquired based on the imaging result after the operation of mounting the component performed by the mounting head, and the state of the solder (the presence or absence of deformation of the solder) may be verified by comparing the acquired height information with a threshold value. In this case, the area of the portion having a height corresponding to the thickness of the solder of the height information may be compared with a threshold value, or the height in the vicinity of the solder of the height information of the solder may be compared with a threshold value.

While the example in which the state of the solder is verified based on the difference image and the height information of the solder has been shown in each of the aforementioned first and second embodiments, the present disclosure is not restricted to this. According to the present disclosure, the state of the solder may be verified based on the difference image without using the height information of the solder.

While the example in which the solder is used as the bonding material in the claims has been shown in each of the aforementioned first and second embodiments, the present disclosure is not restricted to this. According to the present disclosure, other than the solder may be used as the bonding material in the claims.

While the example in which the imaging unit is configured to be capable of imaging the mounting position from the plurality of (two) imaging directions with the plurality of (two) height measurement cameras has been shown in each of the aforementioned first and second embodiments, the present disclosure is not restricted to this. According to the present disclosure, the imaging unit may be configured to be capable of imaging the mounting position from the plurality of imaging directions with a single height measurement camera.

While the example in which the imaging unit is configured to be capable of imaging the mounting position from the two imaging directions has been shown in each of the aforementioned first and second embodiments, the present disclosure is not restricted to this. According to the present disclosure, the imaging unit may be configured to be capable of imaging the mounting position from three or more imaging directions. In this case, height information may be acquired through stereo matching based on imaging results from the three or more imaging directions.

While the example in which the cause of unmounting of the component is inferred based on the measurement result of the thickness of the component, the measurement result of the warpage of the substrate, the measurement result of the presence or absence of foreign matter adhering to the mounting head, and the measurement result of the degree of dryness of the solder in addition to the state of the solder has been shown in the aforementioned second embodiment, the present disclosure is not restricted to this. According to the present disclosure, the cause of unmounting of the component may be inferred based on the state of the solder and at least one of the measurement result of the thickness of the component, the measurement result of the warpage of the substrate, the measurement result of the presence or absence of foreign matter adhering to the mounting head, and the measurement result of the degree of dryness of the solder.

While the processing performed by the controller is described, using the flow described in a manner driven by a flow in which processing is performed in order along a processing flow for the convenience of illustration in each of the aforementioned first and second embodiments, the present disclosure is not restricted to this. According to the present disclosure, the processing performed by the controller may be performed in an event-driven manner in which processing is performed on an event basis. In this case, the processing may be performed in a complete event-driven manner or in a combination of an event-driven manner and a manner driven by a flow.

What is claimed is:

1. A component mounting device consisting of a single apparatus comprising:
   a mounter including a mounting head and configured to mount a component on a bonding material disposed on a substrate;
   a measurement device including at least one of a camera and a displacement sensor and configured to measure a state of the bonding material at least after an operation of mounting the component performed by the mounter; and
   a processor configured to verify the state of the bonding material where the component is unmounted based on a measurement result obtained by the measurement device when defective mounting of the component has occurred due to unmounting of the component; wherein
   the processor is configured to verify a presence or absence of deformation of the bonding material after the operation of mounting the component performed by the mounter as the state of the bonding material, and in a case where there is no deformation of the bonding material, to infer at least one of a predetermined error in a dimension of the component and a downward warpage of the substrate as a cause of the defective mounting of the component.

2. The component mounting device according to claim 1, wherein:
   the processor is configured to infer a cause of the defective mounting of the component based on the state of the bonding material.

3. The component mounting device according to claim 2, wherein:
   the processor is configured to communicate information on the inferred cause of the defective mounting of the component.

4. The component mounting device according to claim 3, wherein:
   the processor is configured to communicate information on causes of the defective mounting of the component in a case where there is the deformation of the bonding material and in a case where there is no deformation of the bonding material.

5. The component mounting device according to claim 3, wherein:
   the processor is configured to infer the cause of the defective mounting of the component based on at least one of a measurement result of a thickness of the component, a measurement result of warpage of the substrate, a measurement result of presence or absence of foreign matter adhering to the mounter, and a measurement result of a degree of dryness of the bonding material in addition to the state of the bonding material, and to communicate the information on the cause of the defective mounting of the component.

6. The component mounting device according to claim 1, wherein:
   the measurement device includes a height measurement device configured to measure a height of the bonding material, and
   the processor is configured to acquire height information of the bonding material based on a measurement result of the height of the bonding material obtained by the height measurement device, and to verify the state of the bonding material based on the acquired height information of the bonding material.

7. The component mounting device according to claim 6, wherein:
   the height measurement device is provided to measure the height of the bonding material before the operation of mounting the component performed by the mounter and the height of the bonding material after the operation of mounting the component performed by the mounter, and
   the processor is configured to verify the state of the bonding material based on a change in the height information of the bonding material before and after the operation of mounting the component performed by the mounter.

8. The component mounting device according to claim 1, wherein:
   the measurement device includes an imager configured to image a predetermined region including the bonding material,
   the imager is configured to image the predetermined region including the bonding material before the operation of mounting the component performed by the mounter and the predetermined region including the bonding material after the operation of mounting the component performed by the mounter, and
   the processor is configured to verify the state of the bonding material based on a change in an imaging result obtained by the imager before and after the operation of mounting the component performed by the mounter.

9. The component mounting device according to claim 8, wherein:
   the processor is configured to verify the state of the bonding material based on a difference image between an image of the predetermined region captured by the imager before the operation of mounting the component performed by the mounter and an image of the predetermined region captured by the imaging portion after the operation of mounting the component performed by the mounter.

10. The component mounting device according to claim 9, wherein:
    the processor is configured to acquire height information of the bonding material based on the imaging result obtained by the imager, and
    the processor is configured to verify the state of the bonding material based on the height information of the bonding material in addition to the difference image.

11. The component mounting device according to claim 8, wherein:
    the processor is configured to verify whether or not the defective mounting of the component has occurred based on the change in the imaging result obtained by the imager before and after the operation of mounting the component performed by the mounter, and
    the processor is configured to verify the state of the bonding material based on the change in the imaging result obtained by the imager before and after the operation of mounting the component performed by the mounter when the defective mounting of the component has occurred.

12. The component mounting device according to claim 1, wherein:
the bonding material includes solder.

\* \* \* \* \*